(12) United States Patent
Teranishi et al.

(10) Patent No.: US 9,010,154 B2
(45) Date of Patent: Apr. 21, 2015

(54) METHOD OF CLEAVING AND SEPARATING A GLASS SHEET

(71) Applicant: Nippon Electric Glass Co., Ltd., Shiga (JP)

(72) Inventors: Yasuo Teranishi, Shiga (JP); Yasuhiro Matsumoto, Shiga (JP); Michiharu Eta, Shiga (JP); Takahide Fujii, Shiga (JP); Naotoshi Inayama, Shiga (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 240 days.

(21) Appl. No.: 13/711,987

(22) Filed: Dec. 12, 2012

(65) Prior Publication Data

US 2013/0174610 A1    Jul. 11, 2013

(30) Foreign Application Priority Data

Dec. 12, 2011   (JP) .................................. 2011-271284

(51) Int. Cl.
*C03B 33/02* (2006.01)
*C03B 33/033* (2006.01)
*H05B 33/10* (2006.01)
*C03B 33/09* (2006.01)

(52) U.S. Cl.
CPC ........... *C03B 33/0222* (2013.01); *C03B 33/033* (2013.01); *H05B 33/10* (2013.01); *C03B 33/091* (2013.01); *H01L 2251/566* (2013.01)

(58) Field of Classification Search
CPC .. C03B 33/02; C03B 33/0222; C03B 33/023; C03B 33/03; C03B 33/033; C03B 33/091; C03B 33/10
See application file for complete search history.

(56) References Cited

U.S. PATENT DOCUMENTS

2010/0294748 A1\* 11/2010 Garner et al. ............ 219/121.72

FOREIGN PATENT DOCUMENTS

| JP | 2006-256944 | 9/2006 |
| JP | 2007-022876 | 2/2007 |
| JP | 2007035912 A \* | 2/2007 |
| WO | 2006/073098 | 7/2006 |

OTHER PUBLICATIONS

Machine Translation of WO 2006073098, Nakazawa et al. Method and Device for Breaking Work, Method for Scribing and Breaking Work, and Scribing Device With Breaking Function, Jul. 13, 2006.\*
International Preliminary Report on Patentability and Written Opinion of the International Searching Authority issued Jun. 26, 2014 in International (PCT) Application No. PCT/JP2012/082163.
International Serach Report mailed Mar. 19, 2013 in International (PCT) Application No. PCT/JP2012/082163.

\* cited by examiner

*Primary Examiner* — Queenie Dehghan
(74) *Attorney, Agent, or Firm* — Wenderoth, Lind & Ponack, L.L.P.

(57) ABSTRACT

Provided is a method of cleaving and separating a glass sheet (G), the method comprising: a cleaving step of cleaving the glass sheet (G) along preset cleaving lines (X, Y) by a laser cleaving method; and a separation step of separating adjacent pieces of the cleaved glass sheet (G) from each other, wherein the cleaving step is performed under a state in which the glass sheet (G) is placed on a sheet (S) having stretchability, and the separation step is performed by stretching the sheet (S).

8 Claims, 2 Drawing Sheets

METHOD OF CLEAVING AND SEPARATING A GLASS SHEET

TECHNICAL FIELD

The present invention relates to a method of cleaving and separating a glass sheet, and more specifically, to a technology for cleaving a glass sheet by a laser cleaving method and then separating pieces of the glass sheet from each other.

BACKGROUND ART

In a process of manufacturing glass sheet products as typified by glass substrates for a plasma display panel (PDP), a field emission display (FED), an electroluminescent display (ELD), and the like, a small-area glass sheet is cut out of a large-area glass sheet and an edge portion extending along each side of the glass sheet is trimmed off. As a method therefor, a method of cleaving a glass sheet is taken as an example.

In this case, a laser cleaving method is taken as one method of cleaving a glass sheet, and for example, this technology is disclosed in Patent Literature 1 described below.

Patent Literature 1 discloses a technology of cleaving a glass sheet by the laser cleaving method in the following manner. That is, an absorption coefficient of the glass sheet for a laser beam is controlled, and the laser beam is caused to pass through a material in a range of the overall thickness thereof, or to pass through the material in a range of up to a sufficient depth even when the laser beam is not caused to pass in the range of the overall thickness. Accordingly, an initial crack formed in an end surface of the glass sheet propagates due to a thermal stress in the range of the overall thickness of the glass sheet.

According to the technology disclosed in Patent Literature 1 described above, for example, the positional accuracy of the cleaving is enhanced and the cleaving speed is increased. Thus, this technology produces various advantages as compared to a conventional method of mechanically cleaving a glass sheet through use of a diamond cutter or the like.

CITATION LIST

Patent Literature

Patent Literature 1: JP 2006-256944 A

SUMMARY OF INVENTION

Technical Problem

Even in the laser cleaving method having excellent characteristics as described above, however, the following problem is inherent due to the fact that opposing cleaved surfaces of the pieces of the cleaved glass sheet are held in proximity to each other.

Specifically, in a case of picking up the pieces of the cleaved glass sheet from a working table for cleaving so as to transfer the pieces of the glass sheet into the subsequent steps, a scratch or a fracture may occur in the cleaved surfaces due to collision and sliding between the cleaved surface of the piece of the glass sheet that is being picked up and the cleaved surface of the piece of the glass sheet that is placed on the working table. As a result, the quality of the glass sheet may be degraded.

Therefore, when transferring the pieces of the cleaved glass sheet, it is necessary to avoid the collision and sliding between the opposing cleaved surfaces of the pieces of the glass sheet, but in actuality, there is no measure taken against the need described above.

The present invention has been made in view of the above-mentioned circumstances, and therefore has a technical object to avoid collision and sliding between cleaved surfaces of pieces of a glass sheet cleaved by a laser cleaving method, thereby preventing a scratch, a fracture, or the like in the cleaved surfaces and eliminating factors of degradation in quality of the glass sheet.

Solution to Problem

According to the present invention which is devised to solve the above-mentioned problem, there is provided a method of cleaving and separating a glass sheet, the method comprising: a cleaving step of cleaving the glass sheet along a preset cleaving line by a laser cleaving method; and a separation step of separating adjacent pieces of the cleaved glass sheet from each other, wherein the cleaving step is performed under a state in which the glass sheet is placed on a sheet having stretchability, and the separation step is performed by stretching the sheet. The phrase "separating from each other" herein refers not only to a case where the pieces of the glass sheet move in opposite directions, but also to a case where the pieces of the glass sheet move along different paths to increase the distance therebetween, a case where a piece of the glass sheet moves in a direction away from another stationary piece of the glass sheet, and a case where the distance between the pieces of the glass sheet moving in the same direction is increased.

According to this method, in the cleaving step, the glass sheet is cleaved by the laser cleaving method under the state in which the glass sheet is placed on the sheet having stretchability. Accordingly, when the sheet is stretched in the separation step, the cleaved surfaces of the adjacent pieces of the cleaved glass sheet can be separated from each other along with the stretch of the sheet. Therefore, even in a case of picking up the pieces of the cleaved glass sheet from the sheet so as to transfer the pieces of the glass sheet into the subsequent steps, collision and sliding between the cleaved surfaces can be avoided effectively. As a result, a scratch or a fracture can be prevented in advance in the cleaved surfaces of the pieces of the glass sheet, and accordingly the factors of degradation in quality of the glass sheet can be eliminated appropriately.

In the above-mentioned method, the preset cleaving line may comprise: a preset transverse cleaving line for forming a transversely cleaved portion extending in a transverse direction of the glass sheet; and a preset longitudinal cleaving line for forming a longitudinally cleaved portion extending in a longitudinal direction of the glass sheet that is orthogonal to the transverse direction. The term "cleaved portion" herein refers to a portion at which the opposing cleaved surfaces of the pieces of the glass sheet are held in proximity to or abutment against each other through the cleaving of the glass sheet.

With this structure, rectangular pieces of the cleaved glass sheet can be obtained, and hence a glass sheet having high frequency of use can be obtained.

In the above-mentioned method, after the cleaving step is performed along the preset transverse cleaving line, the separation step may be performed for the transversely cleaved portion, and then, after the cleaving step is performed along the preset longitudinal cleaving line, the separation step may be performed for the longitudinally cleaved portion.

With this structure, the cleaved surfaces of the pieces of the glass sheet, which is cleaved through the laser cleaving in the cleaving step along the preset transverse cleaving line, are brought into a state of being separated from each other by stretching the sheet in the separation step for the transversely cleaved portion. Accordingly, a predetermined clearance is generated between the opposing cleaved surfaces of the pieces of the glass sheet. The clearance is utilized effectively when an initial crack serving as a start point of laser cleaving along the preset longitudinal cleaving line is formed in an end surface of each piece of the cleaved glass sheet. Therefore, the cleaving step for each piece of the glass sheet along the preset longitudinal cleaving line can be performed smoothly, and thus the workability is enhanced.

In the above-mentioned method, after the cleaving step is performed along the preset transverse cleaving line, the cleaving step may be performed along the preset longitudinal cleaving line, and then the separation step for the transversely cleaved portion and the separation step for the longitudinally cleaved portion may be performed.

With this structure, for example, the separation step for the transversely cleaved portion and the separation step for the longitudinally cleaved portion can be performed simultaneously, and in particular, the workability of the separation step can be enhanced efficiently.

The above-mentioned method may further comprise tilting a part of the sheet with respect to a horizontal plane, to thereby drop and discard a part of a plurality of pieces of the cleaved glass sheet from the sheet. The tilting succeeds the separation step.

With this structure, when any piece of the glass sheet which cannot be used as a product is present in the part of the plurality of the pieces of the cleaved glass sheet due to, for example, a thick selvage portion formed in that piece, the piece of the glass sheet is dropped from the sheet, and can therefore be discarded quickly.

Advantageous Effects of Invention

As described above, according to the present invention, a scratch, a fracture, or the like can be prevented in the cleaved surfaces of the respective pieces of the glass sheet cleaved by the laser cleaving method, and accordingly the factors of the degradation in quality of the glass sheet can be eliminated.

DESCRIPTION OF EMBODIMENTS

In the following, a method of cleaving and separating a glass sheet according to embodiments of the present invention is described with reference to FIGS. 1a to 1h and 2a to 2d in the accompanying drawings.

As a method of cleaving and separating a glass sheet according to a first embodiment of the present invention, the following case is described. That is, as illustrated in FIGS. 1a to 1h, a glass sheet G is cleaved into nine rectangular pieces of the glass sheet G by a laser cleaving method, and the pieces of the cleaved glass sheet G are separated from one another. Then, pieces of the glass sheet G which cannot be used as a product are discarded. Note that, FIGS. 1a to 1g are plan views, and FIG. 1h is a side view as seen in the arrow "D" direction of FIG. 1a.

Figure 1A:
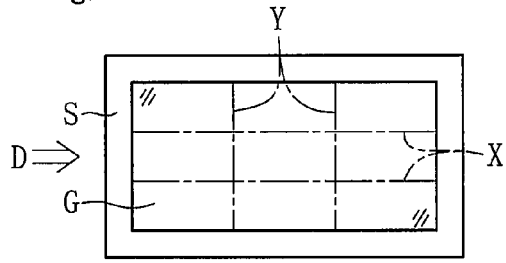
FIG. 1a A plan view illustrating a method of cleaving and separating a glass sheet according to a first embodiment of the present invention.

As illustrated in FIG. 1a, in the first embodiment, the glass sheet G to be cleaved by the laser cleaving method is placed on a sheet S having stretchability (hereinafter referred to simply as "sheet S"). As a material for the sheet S, various materials having stretchability may be used, such as foamed polyethylene, foamed polystyrene, and foamed polypropylene. Further, the coefficient of friction between the glass sheet G and the sheet S is preferably 1.0 or more.

Figure 1B:
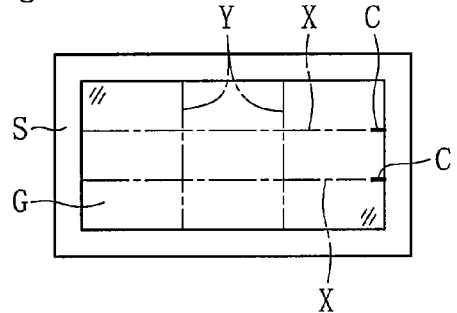
FIG. 1b A plan view illustrating the method of cleaving and separating a glass sheet according to the first embodiment of the present invention.

As illustrated in FIG. 1b, initial cracks C serving as cleaving start points are first formed at two intersections between two preset transverse cleaving lines X of the glass sheet G and one end surface of the glass sheet G (one end surface extending in a direction orthogonal to the preset transverse cleaving lines X). The initial cracks C can be formed by a mechanical method using a wheel or the like, a method of irradiating the glass sheet G with a short pulse laser, or other methods. Subsequently, the glass sheet G is moved while heating the glass sheet G through irradiation with a laser beam along the preset transverse cleaving lines X. Following the irradiation with a laser beam, a coolant such as mist water is jetted along the preset transverse cleaving lines X to cool the glass sheet G. Accordingly, a thermal stress is applied to the glass sheet G, and due to the thermal stress, the initial cracks C propagate along the preset transverse cleaving lines X. Through this cleaving step, the glass sheet G is cleaved as illustrated in FIG. 1c, and transversely cleaved portions XX are formed.

Figure 1C:
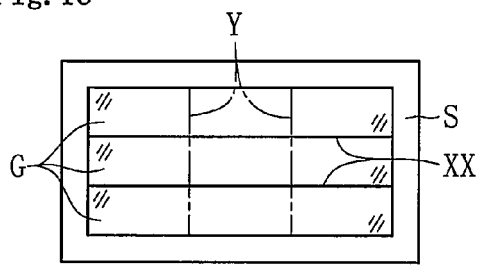
FIG. 1c A plan view illustrating the method of cleaving and separating a glass sheet according to the first embodiment of the present invention.
Figure 1D:
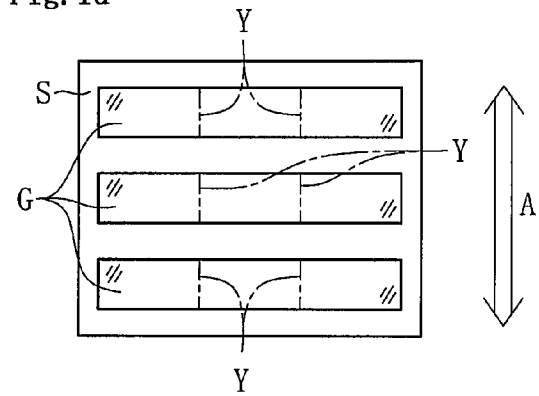
FIG. 1d A plan view illustrating the method of cleaving and separating a glass sheet according to the first embodiment of the present invention.

Under the state of FIG. 1c, as the separation step for the transversely cleaved portions XX of the pieces of the cleaved glass sheet G, the sheet S is stretched in the direction "A" perpendicular to the transversely cleaved portions XX as illustrated in FIG. 1d. Then, the pieces of the cleaved glass sheet G are separated from each other along with the stretch of the sheet S, and hence cleaved surfaces of the pieces of the glass sheet G are inevitably separated from each other as well. In this case, the separation distance between the cleaved surfaces of the pieces of the cleaved glass sheet G is preferably 1 mm or more in consideration of the need to form initial cracks C serving as the cleaving start points in the cleaving step for the pieces of the glass sheet G along preset longitudinal cleaving lines Y after the separation step for the transversely cleaved portions XX.

When cleaving the glass sheet G along the preset transverse cleaving lines X, a part of the sheet S may be melted with a laser beam and welded to the glass sheet G. In this case, slip is less liable to occur in an abutment surface between the sheet S and the glass sheet G. Accordingly, it is possible to enhance, at the time of the separation step for the transversely cleaved portions XX, the efficiency of separation between the cleaved surfaces of the pieces of the cleaved glass sheet G along with the stretch of the sheet S. Further, the welded part is limited, and hence, even when the sheet S is welded to the glass sheet G to be manufactured as a glass substrate, such a situation that the functions of the glass substrate are impaired can be avoided to the extent possible.

Figure 1E:
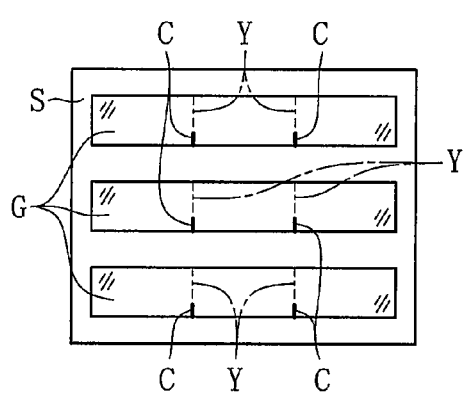
FIG. 1e A plan view illustrating the method of cleaving and separating a glass sheet according to the first embodiment of the present invention.

Subsequently, as illustrated in FIG. 1e, for the pieces of the glass sheet G which are separated at the transversely cleaved portions XX, initial cracks C serving as the cleaving start points are formed at two intersections between the two preset longitudinal cleaving lines Y and one end surface of each piece of the glass sheet G (one end surface extending in a direction orthogonal to the preset longitudinal cleaving lines Y). Those initial cracks C can also be formed by any one of the above-mentioned methods.

Figure 1F:
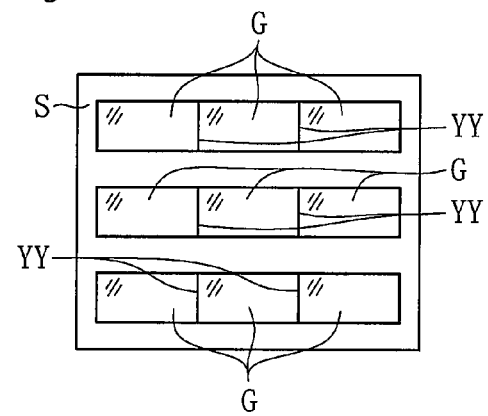
FIG. 1f A plan view illustrating the method of cleaving and separating a glass sheet according to the first embodiment of the present invention.

Under the state of FIG. 1e, the cleaving step is performed through laser cleaving along the preset longitudinal cleaving lines Y. Then, as illustrated in FIG. 1f, the pieces of the glass sheet G are brought into a state of being cleaved along the preset longitudinal cleaving lines Y, and longitudinally cleaved portions YY are formed. Also in the cleaving step of cleaving the pieces of the glass sheet G along the preset longitudinal cleaving lines Y, as described above, a part of the sheet S may be melted with a laser beam and welded to each piece of the glass sheet G. In this case, it is possible to enhance the efficiency of separation between the cleaved surfaces of the pieces of the cleaved glass sheet G described later. Further, the welded part is limited, and hence, even when the sheet S is welded to the pieces of the glass sheet G to be manufactured as a glass substrate, such a situation that the functions of the glass substrate are impaired can be avoided to the extent possible.

Figure 1G:
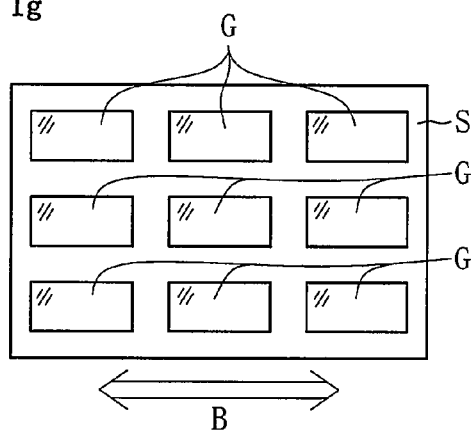
FIG. 1g A plan view illustrating the method of cleaving and separating a glass sheet according to the first embodiment of the present invention.
Figure 1H:
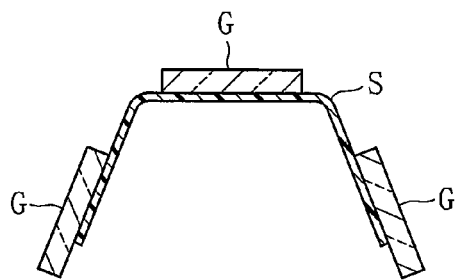
FIG. 1h A side view illustrating the method of cleaving and separating a glass sheet according to the first embodiment of the present invention.

Under the state of FIG. 1f, the sheet S is stretched in the direction "B" perpendicular to the longitudinally cleaved portions YY as illustrated in FIG. 1g. Then, the pieces of the cleaved glass sheet G are separated from each other along with the stretch of the sheet S, and hence the cleaved surfaces of the pieces of the glass sheet G are inevitably separated from each other as well.

When all the pieces of the glass sheet G are brought into the state of being separated from each other as illustrated in FIG. 1g, even in a case of picking up the pieces of the cleaved glass sheet G from the sheet S so as to transfer the pieces of the glass sheet G into the subsequent steps, collision and sliding between the cleaved surfaces can be avoided in advance. Therefore, a scratch or a fracture can be prevented in the cleaved surfaces, and accordingly the factors of degradation in quality of the glass sheet G can be eliminated appropriately.

Further, after the above-mentioned steps are finished, of the plurality of pieces of the cleaved glass sheet G, for example, six pieces of the glass sheet G located at both ends in the direction "A" of FIG. 1d have thick selvage portions formed therein. For example, when those pieces of the glass sheet G cannot be used as a product, both ends of the sheet S in the direction "A" are tilted with respect to a horizontal plane as illustrated in FIG. 1h, to thereby drop and discard the six pieces of the glass sheet G from the sheet S. Accordingly, it is possible to quickly discard those pieces of the glass sheet G.

Figure 2A:
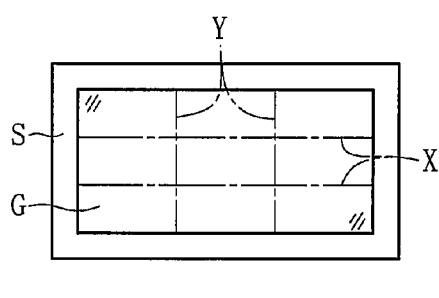
FIG. 2a A plan view illustrating a method of cleaving and separating a glass sheet according to a second embodiment of the present invention.
Figure 2B:
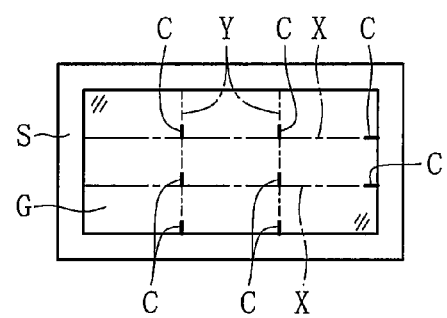
FIG. 2b A plan view illustrating the method of cleaving and separating a glass sheet according to the second embodiment of the present invention.
Figure 2C:
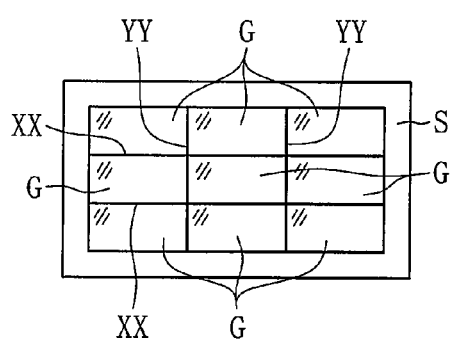
FIG. 2c A plan view illustrating the method of cleaving and separating a glass sheet according to the second embodiment of the present invention.
Figure 2D:
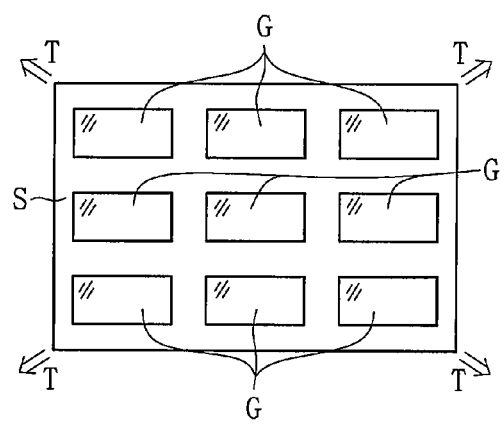
FIG. 2d A plan view illustrating the method of cleaving and separating a glass sheet according to the second embodiment of the present invention.

In the first embodiment described above, the glass sheet G is cleaved along the preset transverse cleaving lines X, and the cleaved surfaces of the pieces of the cleaved glass sheet G are separated from each other at the transversely cleaved portions XX. After that, the pieces of the glass sheet G are cleaved along the preset longitudinal cleaving lines Y, and the cleaved surfaces of the pieces of the cleaved glass sheet G are separated from each other at the longitudinally cleaved portions YY. However, the present invention is not limited to such a structure. For example, as in a second embodiment of the present invention illustrated in FIGS. 2a to 2d, the following structure may be employed. That is, as the cleaving step (FIGS. 2a to 2c), the glass sheet G is cleaved along the preset transverse cleaving lines X and the preset longitudinal cleaving lines Y. Then, as the separation step, in order to perform the separation step for the transversely cleaved portions XX and the separation step for the longitudinally cleaved portions YY, the sheet is stretched in the directions "T" along both diagonal lines of the sheet S as illustrated in FIG. 2d, to thereby separate the cleaved surfaces of the pieces of the cleaved glass sheet G from one another. At this time, the step of separating the transversely cleaved portions XX and the step of separating the longitudinally cleaved portions YY may be performed substantially simultaneously, or performed with a predetermined time interval. In the case of performing those steps with a predetermined time interval, any one of the steps may precede the other. In the case of simultaneously performing the separation step for the transversely cleaved portions XX and the separation step for the longitudinally cleaved portions YY, the working efficiency of the separation step can be enhanced. Note that, in the respective figures illustrating this embodiment, the components having the same functions and shapes as those in the first embodiment described above are represented by the same reference symbols, and redundant description is therefore omitted herein.

Further, in the second embodiment described above, the initial cracks C serving as the start points of cleaving the glass sheet G along the preset longitudinal cleaving lines Y need to be formed at the intersections between the preset transverse cleaving lines X and the preset longitudinal cleaving lines Y without separating the cleaved surfaces after cleaving the glass sheet G along the preset transverse cleaving lines X. In the case of the second embodiment, only a small clearance for forming the initial cracks C is secured between the cleaved surfaces of the pieces of the cleaved glass sheet G, and hence it is preferred that the initial cracks C serving as the start points of cleaving the glass sheet G along the preset longitudinal cleaving lines Y be formed through use of a short pulse laser or the like rather than the mechanical method using a wheel or the like. Further, prior to the cleaving of the glass sheet G along the preset transverse cleaving lines X, the initial cracks C may be provided in advance at the intersections between the preset transverse cleaving lines X and the preset longitudinal cleaving lines Y through use of a short pulse laser.

Further, in the first embodiment described above, after the separation step is performed for the longitudinally cleaved portions YY (stage of FIG. 1g), a part of the plurality of pieces of the cleaved glass sheet G which cannot be used as a product (in the first embodiment, six pieces of the glass sheet G) is discarded. Alternatively, prior to the cleaving of the pieces of the glass sheet G along the preset longitudinal cleaving lines Y after the separation step is performed for the transversely cleaved portions XX (stage of FIG. 1d), a part of the pieces of the glass sheet G which cannot be used as a product may be discarded. Further, an arbitrary portion of the sheet S may be tilted with respect to the horizontal plane so that an arbitrary number of pieces of the glass sheet G can be discarded. For example, the ends of the sheet S at the diagonal lines thereof may be tilted so that, of the plurality of pieces of the cleaved glass sheet G, four pieces of the glass sheet G which are located at corner portions can be discarded.

REFERENCE SIGNS LIST

S stretchable sheet
G glass sheet
X preset transverse cleaving line
Y preset longitudinal cleaving line
XX transversely cleaved portion
YY longitudinally cleaved portion
C initial crack
A direction of stretching stretchable sheet
B direction of stretching stretchable sheet
T direction of stretching stretchable sheet

The invention claimed is:

1. A method of cleaving and separating a glass sheet, the method comprising:
 a cleaving step of cleaving the glass sheet along a preset cleaving line by a laser cleaving method; and
 a separation step of separating adjacent pieces of the cleaved glass sheet from each other,
 wherein the cleaving step is performed under a state in which the glass sheet is placed on a stretchable sheet and under a state in which the glass sheet is not affixed to the stretchable sheet, and the separation step is performed by stretching the stretchable sheet.

2. The method of cleaving and separating a glass sheet according to claim 1, wherein the preset cleaving line comprises:
 a preset transverse cleaving line for forming a transversely cleaved portion extending in a transverse direction of the glass sheet; and
 a preset longitudinal cleaving line for forming a longitudinally cleaved portion extending in a longitudinal direction of the glass sheet that is orthogonal to the transverse direction.

3. The method of cleaving and separating a glass sheet according to claim 2, wherein, after the cleaving step is performed along the preset transverse cleaving line, the separation step is performed for the transversely cleaved portion, and then, after the cleaving step is performed along the preset longitudinal cleaving line, the separation step is performed for the longitudinally cleaved portion.

4. The method of cleaving and separating a glass sheet according to claim 3, further comprising tilting a part of the stretchable sheet with respect to a horizontal plane, to thereby drop and discard a part of a plurality of pieces of the cleaved glass sheet from the stretchable sheet,
 wherein the tilting succeeds the separation step.

5. The method of cleaving and separating a glass sheet according to claim 2, wherein, after the cleaving step is performed along the preset transverse cleaving line, the cleaving step is performed along the preset longitudinal cleaving line, and then the separation step for the transversely cleaved portion and the separation step for the longitudinally cleaved portion are performed.

6. The method of cleaving and separating a glass sheet according to claim 5, further comprising tilting a part of the stretchable sheet with respect to a horizontal plane, to thereby drop and discard a part of a plurality of pieces of the cleaved glass sheet from the stretchable sheet,
 wherein the tilting succeeds the separation step.

7. The method of cleaving and separating a glass sheet according to claim 2, further comprising tilting a part of the stretchable sheet with respect to a horizontal plane, to thereby drop and discard a part of a plurality of pieces of the cleaved glass sheet from the stretchable sheet,
 wherein the tilting succeeds the separation step.

8. The method of cleaving and separating a glass sheet according to claim 1, further comprising tilting a part of the stretchable sheet with respect to a horizontal plane, to thereby drop and discard a part of a plurality of pieces of the cleaved glass sheet from the stretchable sheet,
 wherein the tilting succeeds the separation step.

* * * * *